US008826209B2

(12) United States Patent
Kramer et al.

(10) Patent No.: US 8,826,209 B2
(45) Date of Patent: Sep. 2, 2014

(54) AUTOMATED INLINE DEFECT CHARACTERIZATION

(75) Inventors: James Robert Kramer, The Colony, TX (US); Ankush Oberai, Fremont, CA (US)

(73) Assignee: Synopsys, Inc., Mountain View, CA (US)

(\*) Notice: Subject to any disclaimer, the term of this patent is extended or adjusted under 35 U.S.C. 154(b) by 0 days.

(21) Appl. No.: 13/539,249

(22) Filed: Jun. 29, 2012

(65) Prior Publication Data
US 2013/0007684 A1 Jan. 3, 2013

Related U.S. Application Data

(60) Provisional application No. 61/503,289, filed on Jun. 30, 2011.

(51) Int. Cl.
*G06F 17/50* (2006.01)

(52) U.S. Cl.
CPC .................. *G06F 17/5081* (2013.01)
USPC ............ 716/112; 716/106; 716/111

(58) Field of Classification Search
USPC .......... 716/51, 52, 54, 106, 111, 112
See application file for complete search history.

(56) References Cited

U.S. PATENT DOCUMENTS

| 7,570,796 | B2* | 8/2009 | Zafar et al. ..................... 382/144 |
| 7,626,163 | B2* | 12/2009 | Honda .......................... 250/306 |
| 7,847,937 | B1 | 12/2010 | Bevis |
| 7,873,204 | B2 | 1/2011 | Wihl et al. |
| 7,873,585 | B2 | 1/2011 | Izikson |
| 8,126,255 | B2* | 2/2012 | Bhaskar et al. ............... 382/141 |
| 8,194,968 | B2* | 6/2012 | Park et al. ..................... 382/145 |
| 2007/0274593 | A1* | 11/2007 | Tsuneta et al. ................ 382/192 |
| 2009/0196490 | A1* | 8/2009 | Matsumiya ................... 382/149 |
| 2010/0238433 | A1 | 9/2010 | Lange et al. |
| 2011/0191725 | A1* | 8/2011 | Oberai ........................... 716/52 |

\* cited by examiner

*Primary Examiner* — Sun Lin
(74) *Attorney, Agent, or Firm* — Adams Intellex, PLC

(57) ABSTRACT

Defect characterization is a useful tool for analyzing and improving fabrication for semiconductor chips. By using layout and netlist in combination with images of semiconductors, defects can be identified and analyzed. Electrical simulation can be performed on the netlist, based on the presence of the defect that was detected. Layout geometries where the defect was detected can be binned and a search can be performed of the remainder of the layout for similar groupings of layout geometries. Various representations of the semiconductor can be cross mapped, including layout, schematic, and netlist. The presence of certain defects can be correlated to yield, performance, and other characteristics.

41 Claims, 8 Drawing Sheets

AUTOMATED INLINE DEFECT CHARACTERIZATION

RELATED APPLICATIONS

This application claims the benefit of U.S. provisional patent application "Automated Inline Defect Characterization" Ser. No. 61/503,289, filed Jun. 30, 2011. The foregoing application is hereby incorporated by reference in its entirety.

FIELD OF INVENTION

This application relates generally to failure analysis and more particularly to automated inline defect characterization.

BACKGROUND

Integrated circuit design and fabrication is a vastly complex effort and involves interaction between numerous steps in a manufacturing process. While going through the various steps in the design process, an understanding is required of the limitations of the manufacturing process. Shapes must be designed which can be fabricated so that the desired electronic circuit function is implemented at the resulting end of fabrication. Frequently, millions and even hundreds of millions of transistors can exist on a single semiconductor chip. Each transistor is composed of shapes for diffusion, polysilicon, contacts, metallization, and other structures. The ability to design chips with such large numbers of essential transistors can be quite challenging and optimization of the circuitry as needed can be a daunting task even with the help of electronic design automation (EDA) software tools.

There are numerous metal lines of miniscule dimension in close proximity to one another on each semiconductor chip. Further, there are diffusions, polysilicon shapes, and insulator layers, all of which must be fabricated to exacting tolerances. As technologies have advanced, smaller and smaller dimensions are used in lithography. These smaller dimensions allow for smaller defects to have a greater impact. A defect can impact a circuit by bridging between two structures, thereby causing a short or resistive short, or even by increasing capacitance between adjacent structures. Defects can enter a semiconductor chip at each step in the fabrication process. No amount of effort will ever eliminate defects from the manufacturing process. Further, failures on semiconductor chips may be the result of random defects or systematic defects on the chips.

SUMMARY

Inline defect characterization involves analyzing a semiconductor wafer at various steps as the wafer proceeds through the fabrication process. A computer implemented method for defect characterization is disclosed comprising: importing a layout for a semiconductor circuit; importing a netlist for the semiconductor circuit; obtaining images of a semiconductor chip which comprises the semiconductor circuit during fabrication; detecting a defect in one of the images of the semiconductor chip wherein the defect is at a location on a portion the semiconductor chip that is represented by the layout; and performing electrical analysis of the netlist with the defect which was detected. The detecting the defect may be accomplished inline during semiconductor manufacturing. The method may further comprise importing a schematic for the semiconductor circuit. The method may further comprise cross mapping between two of a group comprising the netlist, the schematic, and the layout. The defect may be detected using one of a group comprising an optical microscope and a scanning electronic microscope. The defect may be emphasized using voltage contrast. The method may further comprise identifying an intersection of nets based on a failure of electrical operation. The obtaining of the images may be based on the intersection of the nets which were identified. The method may further comprise determining a critical dimension. The method may further comprise filtering out defects smaller than the critical dimension. The critical dimension may be between shapes on a single level. The method may further comprise determining a critical volume. The method may further comprise filtering out defects smaller than the critical volume. The critical volume may be between shapes on a plurality of levels. The method may further comprise ranking the defect and a second defect based on their impact to operation of the semiconductor circuit.

In some embodiments, the method may further comprise using an uncertainty value for the location to determine a range of possible defect locations. The method may further comprise analyzing the possible defect locations for impact to operation of the semiconductor circuit. The method may further comprise determining a cell in the semiconductor circuit in which the defect resides. The method may further comprise extracting nets from the cell. The method may further comprise extracting nets from one or more adjacent cells surrounding the cell. The one or more adjacent cells may be at the same level of hierarchy in the netlist as the cell. The one or more adjacent cells may be at a different level of hierarchy in the netlist as the cell. The method may further comprise binning nets within the cell into a group of nets. The cell may be a custom cell. The cell may be a standard cell. The method may further comprise correlating an impact of the defect on electrical operation of the semiconductor circuit. The correlating may relate to one of a group comprising yield analysis, parametric information, fabrication process data, and circuit speed. The method may further comprise classifying the defect which was detected. The electrical analysis of the netlist with the defect may be performed using transistor level simulation. The transistor level simulation may include Monte Carlo analysis. The method may further comprise searching through the layout for similar geometries to the layout of the portion of the semiconductor chip where the defect was detected. The one or more additional defects may be detected on the similar geometries. The method may further comprise performing categorical binning of the similar geometries. The method may further comprise producing a series of modulated lithography exposures; examining shapes produced by the series of modulated lithography exposures; and identifying marginal structures where a similar defect to the defect that was detected would impact circuit operation based on the series of modulated lithography exposures. The method may further comprise storing results of the electrical analysis. The method may further comprise displaying waveforms from the electrical analysis. The method may further comprise storing an image of the portion of the layout. The defect may be a systematic defect. The defect may be a random defect. The method may further comprise providing CAD navigation on the semiconductor chip to the location where the defect was detected.

In embodiments, a computer program product embodied in a non-transitory computer readable medium for defect characterization may comprise: code for importing a layout for a semiconductor circuit; code for importing a netlist for the semiconductor circuit; code for obtaining images of a semiconductor chip which comprises the semiconductor circuit during fabrication; code for detecting a defect in one of the images of the semiconductor chip wherein the defect is at a location on a portion the semiconductor chip that is represented by the layout; and code for performing electrical analysis of the netlist with the defect which was detected. In some embodiments, the computer program product may include code for importing a layout for a semiconductor circuit; code for importing a netlist for the semiconductor circuit; code for obtaining images of a semiconductor chip which comprises the semiconductor circuit during fabrication; code for detecting a defect larger than a critical dimension in one of the images of the semiconductor chip; and code for performing electrical analysis of the netlist with the detected defect. In embodiments, a computer system for defect characterization may comprise: a memory for storing instructions; one or more processors coupled to the memory wherein the one or more processors, when executing the instructions which are stored, are configured to: import a layout for a semiconductor circuit; import a netlist for the semiconductor circuit; obtain images of a semiconductor chip which comprises the semiconductor circuit during fabrication; detect a defect in one of the images of the semiconductor chip wherein the defect is at a location on a portion the semiconductor chip that is represented by the layout; and perform electrical analysis of the netlist with the defect which was detected.

Various features, aspects, and advantages of numerous embodiments will become more apparent from the following description.

BRIEF DESCRIPTION OF THE DRAWINGS

The following detailed description of certain embodiments may be understood by reference to the following figures wherein.

DETAILED DESCRIPTION

Figure 1:
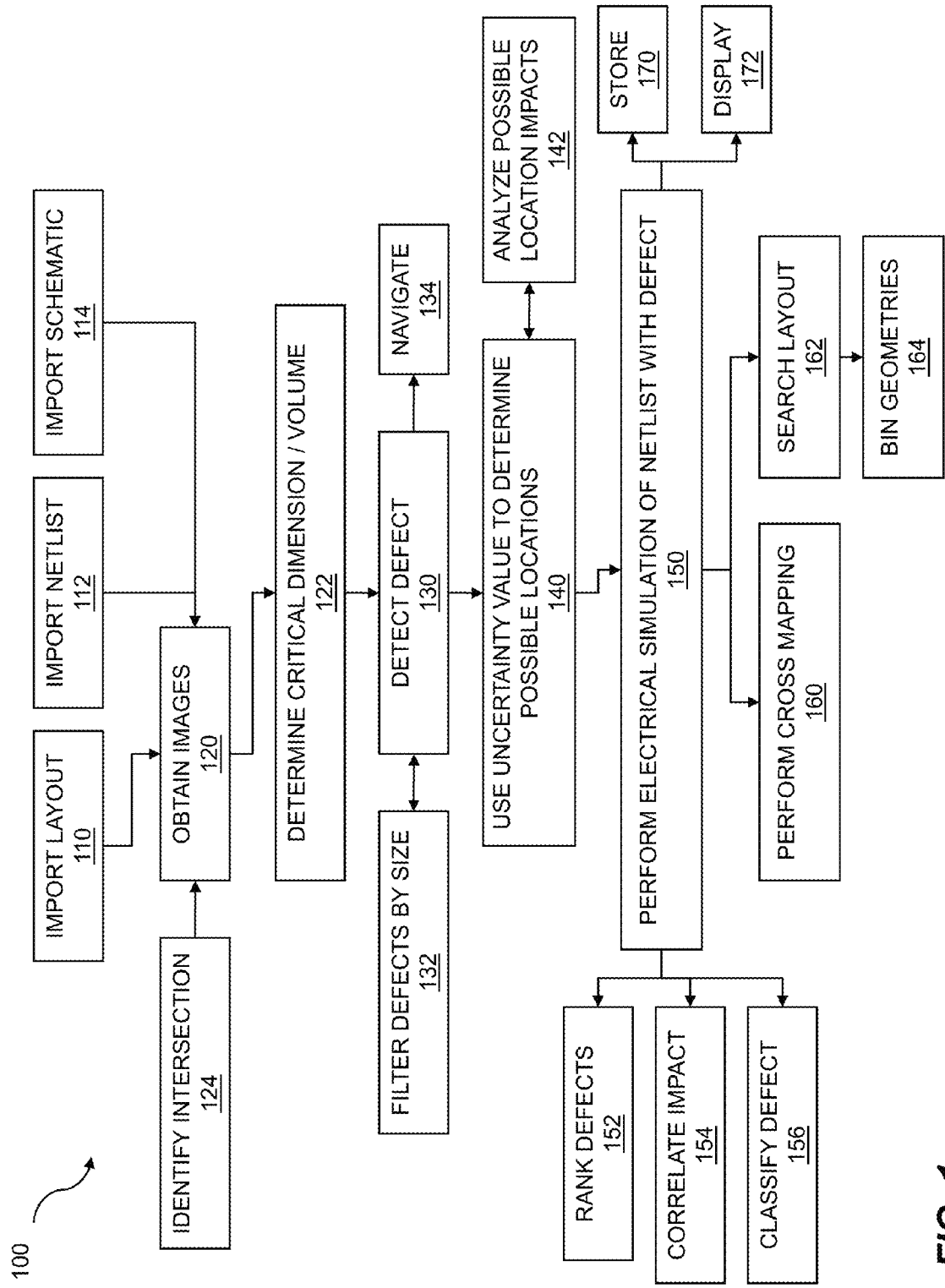
FIG. 1 is a flowchart for defect characterization.

Defects land on or are created in semiconductor devices at the time of fabrication. These defects are normally are only identified once a semiconductor wafer has finished fabrication and a chip fails electrically. Being able to monitor and identify defects during the fabrication process is critical to provide feedback to the manufacturing process to reduce defects and thereby improve process yield. The present disclosure provides a description of various methods, systems, and apparatus associated with inline defect characterization in an automated fashion. Defects may enter onto semiconductor wafers at each step in the fabrication process. Inline characterization refers to analyzing the wafers as they go through this fabrication process. Other types of characterization are possible such as the analysis that is done after semiconductor wafer fabrication is complete. When fabrication is complete, the chips on the semiconductor wafer can be electrically tested as well as be visually inspected. Visual inspection at completion of fabrication misses certain defects because the defects are covered by other structures on the chip.

By identifying and classifying defects during the fabrication process, certain chips can be determined as failure candidates that deserve no further inspection or testing. There are certain defects which, when present, indicate that the chips are not desirable regardless of the outcome of electrical testing. In some cases certain defects may even be determined to be reliability defects, as opposed to time zero defects, where electrical testing would indicate that a chip is good but which would fail after a short time in the field.

Automated inline defect characterization and classification may be based on a defect's impact to an electrical circuit using layout analysis and netlist cross-mapping correlation. During semiconductor manufacturing, physical and electrical defects may be detected using high throughput optical or scanning electronic microscope (SEM) based inspection and microscope systems. As design density increases, inline inspection tools are able to detect smaller and smaller defects of interest (DOI) that can effectively cause shorts across critical dimensions (CD) or cause functional failure. A critical dimension is defined as the distance between one electrically active path and another electrically active path. Thus a bridging defect with a size equal to or greater than the critical dimension that causes a short is clearly undesirable. As critical dimensions become smaller, the number of inline defects of concern may increase exponentially. As a result, the number of defects reported may increase dramatically with operators no longer being able to (1) manually review and classify the required number of defects for each inline critical process step, (2) properly classify what is very difficult to see and thus correctly classify, (3) inspect those areas of the device that are most critical and filter out the remaining areas and defects, and (4) inspect those defects that can functionally effect the device. Therefore concepts are disclosed for continuous process quality and yield impact estimation.

The presented method comprises automated defect classification using a design database which includes both the physical representation or layout of an integrated circuit (IC) and the corresponding electrical netlist. In some cases the electrical representation may be in the form of a standard netlist such as Verilog™, VHDL™, transistor level netlist, or the like. In some cases the electrical representation may be of the form of schematics. Whenever a netlist is mentioned in this disclosure it should be understood that other forms of electrical representation are equally possible. In some embodiments, both netlists and schematics may be used together. By correlating the defect of interest to the layout and netlist, defects can be classified and unimportant defects can be filtered out based upon the impact of the defect to the integrity of the electrical circuit. This practice can both dramatically reduce the number of defects required to be considered for inspection and rank defects based upon their impact to the functional integrity of the device. This type process can both increase production output and increase yield enhancement programs dramatically, particularly for technology nodes at and below 45 nanometers.

Once a defect is identified its wafer coordinates may be converted into a corresponding layout position. A rectangular area around this position may be defined by taking into account the reported defect size and an uncertainty regarding the exact defect location due to various challenges including inspection tool inaccuracy. The area defined within the rectangular area is analyzed by an algorithm which finds the different signals. The various geometric shapes and layout polygons are analyzed. A cross-mapping algorithm is applied to each signal and the corresponding netlists associated with each defect can be calculated.

A netlist may be represented using a chain of strings from which the exact design hierarchy and cell instantiation can be retrieved. Each node in the circuitry may be represented within a netlist from which the parent cells can be recursively extracted. As a result, defects can be binned together which are associated with some common cell within the hierarchy.

Typically, an integrated circuit is designed by placing and reusing standard and custom library cells arranged using a hierarchical composition. In a typical situation, standard cells have been intensively qualified with fabricator yield and manufacturing data being recorded, while custom cells present much more uncertainty regarding their manufacturability and printability. The disclosed methods allow filtering of defects located on both standard cells and custom cells. The methods can be easily integrated into a general sampling strategy for defect selection and efficient process monitoring.

Cell sensitivity to process variation can be calculated using transistor level modeling and Monte Carlo analysis. The transistor level modeling may be with Spice™ or a Spice-like simulator. During the manufacturing process defects could be filtered out which are located on those cells for which process variation sensitivity analysis has already been performed. Filtering out both inline defects and layout regions not required for analysis can rapidly increase time to yield and reduce overall manufacturing costs to produce a device. Expensive inline inspection tools can, in this manner, be more efficiently used and thus reduce the tool's cost of ownership.

During a lithography qualification process, printing errors may be analyzed and defects associated with similar geometries may be binned together. This process may be referred to as design based binning. The method separates systematic defects from random defects occurring at any place with the same probability. Systematic defects may include those defects found with high frequency near some similar layout arrangement. These methods can be used to perform inline defect classification. Validating a defect impact on an electrical circuit enables a more accurate way to determine the defect's true functional effect on a device. The disclosed method further enables the ranking and the quantification of different defects based on electrical impact to circuitry, percentage of standard or custom cells with defects, and breakdown of systematic defects on a per cell basis.

FIG. 1 is a flowchart for defect characterization. A flow 100 is described for a computer implemented method for performing defect characterization. The flow 100 may begin with importing a layout 110 for a semiconductor circuit. The layout may be in the form of GDSII or OASIS™ or some other format for describing various shapes, sizes, and relationships of elements in a semiconductor layout. The layout may be for a semiconductor chip or die. The layout may be imported into a database to be included with other information about the chip. All chip layers may be imported, a subset of the chip layers, or only a single layer. In some embodiments, the layout may already reside within a software tool and importing may be construed as using a layout already present in the tool. The flow 100 includes importing a netlist 112 for the semiconductor circuit. The netlist may be in Verilog™, VHDL™, transistor level netlist, or other hardware description language (HDL). The netlist may be imported into a database to be included with other information about the chip. The entire chip hierarchy may be imported or a subset of the chip circuitry. In embodiments, a flat netlist is imported. In some embodiments, the netlist may already reside within a software tool and importing may be construed as using a netlist already present in the tool. The flow 100 may include importing a schematic 114 for the semiconductor circuit. The schematic may be a graphical representation of the logical blocks, individual transistors, or other components of a semiconductor chip and interconnections between the blocks, transistors, or components. The schematic may be imported into a database to be included with other information about the chip. The entire chip schematic may be imported or a schematic for a subset of the chip circuitry. In some embodiments, the schematic may already reside within a software tool and importing may be construed as using a schematic already present in the tool.

The flow 100 continues with obtaining images 120 of a semiconductor chip which comprises the semiconductor circuit during fabrication. The images may be obtained with an optical microscope, a scanning electronic microscope, or some other microscope system. The images may be captured with a CCD, a video camera, a thermal imager, or other camera type apparatus. The images may emphasize one or more defects using voltage contrast. In some embodiments, the flow may include identifying an intersection 124 of nets based on a failure of electrical operation. A defect at a specific intersection may cause a pair of nets to both have degraded operation, such as a short between the nets. Given the electrical failure, the obtaining of the images may be based on the intersection of the nets which were identified.

The flow 100 may continue with determining a critical dimension 122. A critical dimension may be the distance between two polygons where a defect exceeding the critical dimension would cause a bridge between the two shapes and the critical dimension is between shapes on a single level. These two polygons may be on the same fabrication level, such as for example second level metal. In some embodiments, a critical dimension may be known to be different from the distance between two polygons because rounding, necking, and other fabrication issues cause shapes to distort from the originally designed shapes. In certain cases a critical dimension for a defect may not be the size required to cause a bridge but only cause some other degradation in a circuit performance such as an increase in capacitance or the like. The flow 100 may include determining a critical volume 122. A critical volume is similar to a critical dimension but may be used to describe a defect size concern between multiple levels and the critical volume is between shapes on a plurality of levels. There may be a distance of concern between two polygons on two levels where a defect exceeding the critical volume would cause a bridge between the two levels. In some embodiments, a critical volume may be known to be different from the distance between two levels because non-planarity and other fabrication issues cause shapes to distort from the originally designed shapes. In certain cases a critical volume for a defect may not be the size required to cause a bridge but only cause some other degradation in a circuit performance such as an increase in capacitance or the like. One example of multiple levels would be the levels of first level metal and second level metal and a defect might form a bridge connection between these two layers. Any manufacturing levels could be used in such critical dimension or volume analysis including n-diffusion, p-diffusion, n-well, p-well, polysilicon, contact, metal one, metal two, metal three, metal four, metal five, metal six, via one, via two, via three, via four, via five, as well as numerous others.

The flow 100 continues with detecting a defect 130 in one of the images of the semiconductor chip wherein the defect is at a location on a portion the semiconductor chip that is represented by the layout. In embodiments, the detecting the defect is accomplished inline during semiconductor manufacturing. The defect may be a systematic defect or a random defect. Detection of the defect may be accomplished by software inspection of the images which were obtained looking for an anomaly in the images. A golden set of images may be used where the golden set are known good images. Alternatively, expected shapes or images may be generated based on the layout for the semiconductor chip and shapes which do not fit those expected shapes or images be identified. Further, missing shapes in the images may be identified as a defect.

The flow 100 may include filtering out defects based on size 132 where the defect is smaller than the critical dimension when a defect is detected which could affect a single layer in the manufacturing process. The flow may include filtering out defects smaller than the critical volume. Defects can be present on a semiconductor chip without impacting the operation of the chip. When a defect is smaller than a critical size then it may reside on the chip without any deleterious effect. Defects larger than a critical size in a specific portion of the chip may short out multiple structures causing an operational failure. In embodiments, the flow 100 includes providing CAD navigation 134 on the semiconductor chip to the location where the defect was detected. A prober or microscope may be navigated to the defect location for further analysis by the system or by a human operator.

The flow 100 may continue with using an uncertainty value for the location to determine a range of possible defect locations 140. An uncertainty value may be based on inaccuracies in image, image location, defect size, defect focus, defect shape, microscope alignment, chip or wafer alignment, and numerous other factors. One or more uncertainty values may be used to evaluate the defect and its location. The uncertainty value may be used from a two-dimensional perspective, looking for defect impact on structures within one manufacturing layer. Alternatively, the uncertainty value may be used from a three-dimensional perspective to determine a range of possible defect locations and the associated impact between chip structures on differing levels. The flow 100 may include analyzing the possible defect locations for impact 142 to operation of the semiconductor circuit. The impact may include having missing connection, resistive connections, additional capacitance, capacitive coupling between signals, or other degradations.

The flow 100 continues with performing electrical analysis of the netlist with the defect which was detected. The analysis may include electrical simulation of the netlist with the defect 150. The electrical analysis may include Verilog™, VHDL™, or other type of logical simulation. The electrical analysis of the netlist with the defect may be performed using transistor level simulation such as Spice™ or a similar tool. The transistor level simulation may include Monte Carlo analysis for a range of defect locations, for a range of resistive shorts, or other defect characteristic. The flow 100 may include ranking the defect 152 and a second defect based on their impact to operation of the semiconductor circuit. Multiple defects may be detected on the images which were obtained. Based on the location and size of the various defects, the impacts could be different. A small defect in a very critical portion of the circuitry could have a much larger impact on operation. Therefore, defects may be ranked from having the largest impact to a much smaller possible impact on operation. In some cases, certain defects may be ranked such that no operational impact is expected because the defects are small or not in an active circuit area on the chip.

The flow 100 may include correlating an impact 154 of the defect on electrical operation of the semiconductor circuit. The correlating may relate to yield analysis, parametric information, fabrication process data, or circuit speed. The presence of a certain defect may be determined, for instance, to correspond to a reduction in yield based on previous experience with certain defects in specific locations. A defect may also correlate to a certain impact on circuit operation. When a semiconductor chip is fabricated with a certain defect a specific defective circuit operation may be detected. In some cases electrical testing of a completed chip may be performed and failure detected. Subsequently, failure analysis may be performed to delayer and identify the cause of failure. Alternatively, defects may be detected inline and the semiconductor chip may go through further fabrication. Electrical test of the fabricated chip may provide information on the operational impact of the defect which was previously detected. Defects which cause a certain failure may be categorized and information stored in a database for future reference. Then when similar defects are found, anticipated impacts of those similar defects may be determined. Various defects may be detected inline during the fabrication process. These defects may be correlated to impacts previously seen based on failure analysis.

The flow 100 may include classifying the defect 156 which was detected. Classification may include identifying whether a defect is a short, a resistive short, a capacitive link, a reliability defect, a defect that will have no impact, or the like. Classification may include the layer where the defect came from during the fabrication process. Classification may include the material of the defect. Classification may include whether the defect is a systematic or a random defect. Classification may also include custom descriptions codes, the severity level of the defect, and description of the defect. Various other classifications are possible as well.

The flow 100 may include cross mapping 160 between two of a group comprising the netlist, the schematic, and the layout. A display of semiconductor layout and netlist is possible. The location of a defect may be shown on both the layout and the netlist by highlighting or otherwise indicating the area of a problem. Images, schematics, and other representations may be displayed for the semiconductor. The defect and associated locations and/or impacts may be shown in each of the representations.

The flow 100 may include searching through the layout 162 for similar geometries to the layout of the portion of the semiconductor chip where the defect was detected. A specific geometric pattern for one or more layers may be identified where defects may occur. This geometric pattern may happen in other locations across a semiconductor chip. By searching through the semiconductor layout, specific spots to look for defects may be identified. In this manner, spots of specific concern may be quickly reviewed in various locations on the chip. One or more additional defects may be detected on similar geometries.

The flow 100 may include performing categorical binning of the similar geometries 164. Groups of similar geometries may be identified and categorized. The categorizations may include the level where a defect can occur. Categorizations can include sizes of geometries where the sizes are useful for determining when a specific size defect will impact circuit operation. Various other type binnings of geometries are possible.

The flow 100 may include storing 170 results of the electrical analysis or an image of the portion of the layout. The storing may also include information on defects found, images obtained, critical dimensions determined, geometries binned, as well as numerous other aspects. The flow 100 may include displaying 172 waveforms from the electrical analysis. The waveforms may be from Verilog™, VHDL™, Spice™, or other type simulation analysis. Various steps in the flow 100 may be changed in order, repeated, omitted, or the like without departing from the disclosed inventive concepts. Various embodiments of the flow 100 may be included in a computer program product embodied in a non-transitory computer readable medium that includes code executable by one or more processors.

Figure 2:
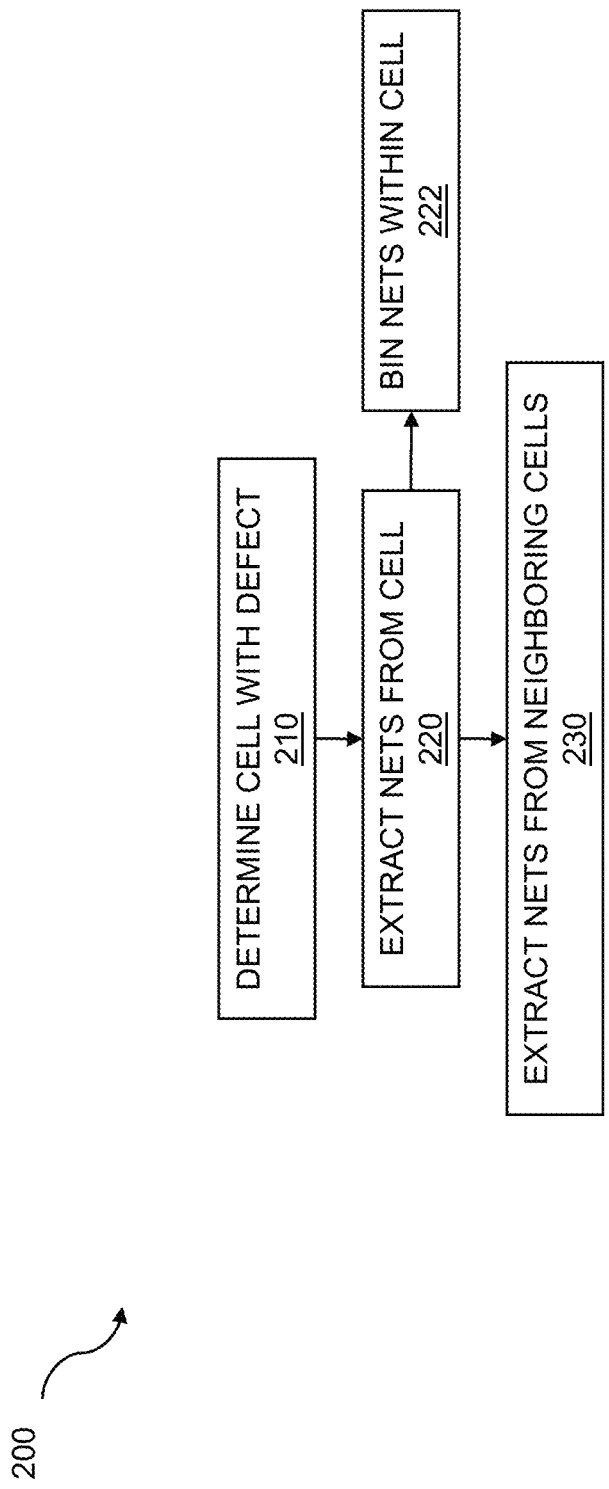
FIG. 2 is a flowchart for net analysis.

FIG. 2 is a flowchart for net analysis. A flow 200 is described for a computer implemented method for performing defect characterization using net analysis. The flow 200 may include determining a cell in the semiconductor circuit in which the defect resides 210. The cell may be a custom cell or a standard cell. Once a defect has been detected 130 the semiconductor layout can be examined and a physical layout cell can be identified in which the defect exists. The flow 200 may continue with extracting nets from the cell 220. Once the cell has been identified, the various nets within the cell can be extracted or identified resulting in a netlist for the cell along with the location for the defect in the netlist. In some embodiments, the netlist can be cross mapped showing some or all of the layout, images, schematic, and other representations of the circuit and defect. The flow 200 may include binning nets within the cell 222 into a group of nets. Binning may be done based on nets affected by the defect or nets which are in contact with the defect. Binning may be done based on nets which are logically upstream from the defect or logically downstream from the defect. Defect analysis may be done based on geometries that are more susceptible to defects. Various other types of binning are possible. The flow 200 may include extracting nets from neighboring cells 230 such as extracting nets from one or more adjacent cells surrounding the cell. The cells may be physically adjacent to the cell with the defect. The adjacent cells may be at the same level of hierarchy in the netlist as the cell. Alternatively, the adjacent cells may be at a different level of hierarchy in the netlist from the cell. In some cases a defect may span between one cell and its neighbor. When this is the case a defect may cause a short or other defective operation between a net in one cell and another net in a neighbor cell. Therefore extracting nets from multiple cells may be needed in order to perform electrical simulation of the netlist with the defect present. Various steps in the flow 200 may be changed in order, repeated, omitted, or the like without departing from the disclosed inventive concepts. Various embodiments of the flow 200 may be included in a computer program product embodied in a non-transitory computer readable medium that includes code executable by one or more processors.

Figure 3:
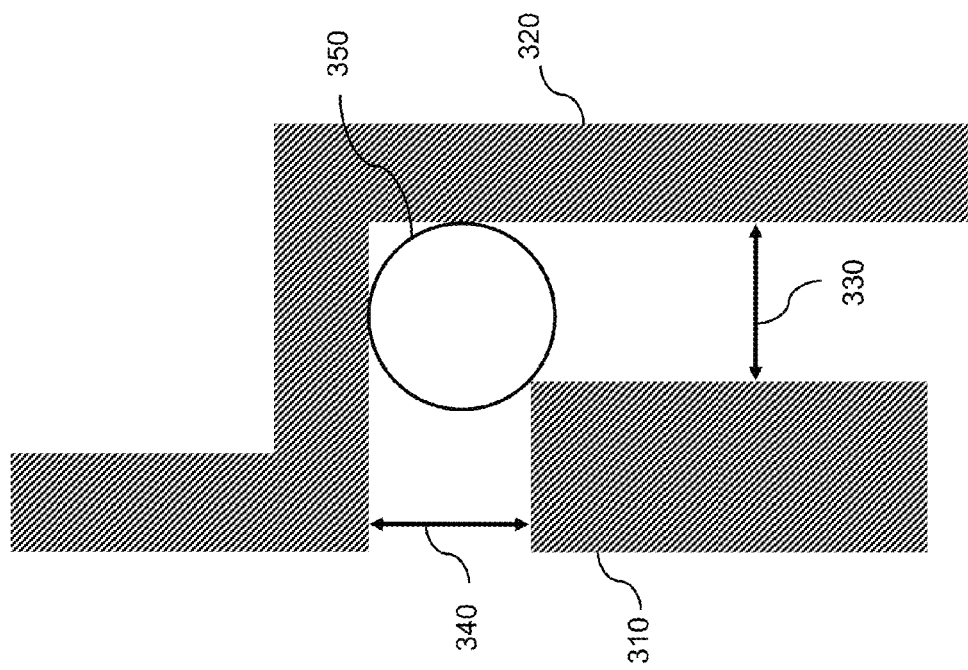
FIG. 3 is a diagram showing example critical dimension analysis.

FIG. 3 is a diagram showing example critical dimension analysis. In this example figure almost any semiconductor structure could be considered including n-diffusion, p-diffusion, n-well, p-well, polysilicon, contact, metal one, metal two, metal three, metal four, metal five, metal six, via one, via two, via three, via four, via five, as well as numerous others. The critical dimension concepts are also equally applicable to determine a critical dimension or critical volume between multiple semiconductor structures including those listed above. In FIG. 3 a first structure 310 is shown adjacent to a second structure 320. The second structure 320 includes a jog. Along the side of the first structure 310 the distance between the first structure 310 and the second structure 320 is an x-dimension distance 330. Any defect larger than the x-dimension distance 330 could cause a bridge between the first structure 310 and the second structure 320.

Along the top of the first structure 310 there is a y-dimension distance 340 between the first structure 310 and the second structure 320. Any defect larger than the y-dimension distance 340 could cause a bridge between the first structure 310 and the second structure 320. When a defect is in the corner of the jog by the second structure 320 around the first structure 310, a defect with a diameter larger than that of a circle 350 could cause a bridge between the first structure 310 and the second structure 320. Depending on the location of the defect, the critical dimension could be the x-dimension distance 330, the y-dimension distance 340, or the circle diameter 350. In some cases a critical dimension may be smaller than one of these dimensions because of uncertainty in a defect size, due to the ability of a resistance to bridge a further distance than just the raw defect size, or other reason.

Figure 4:
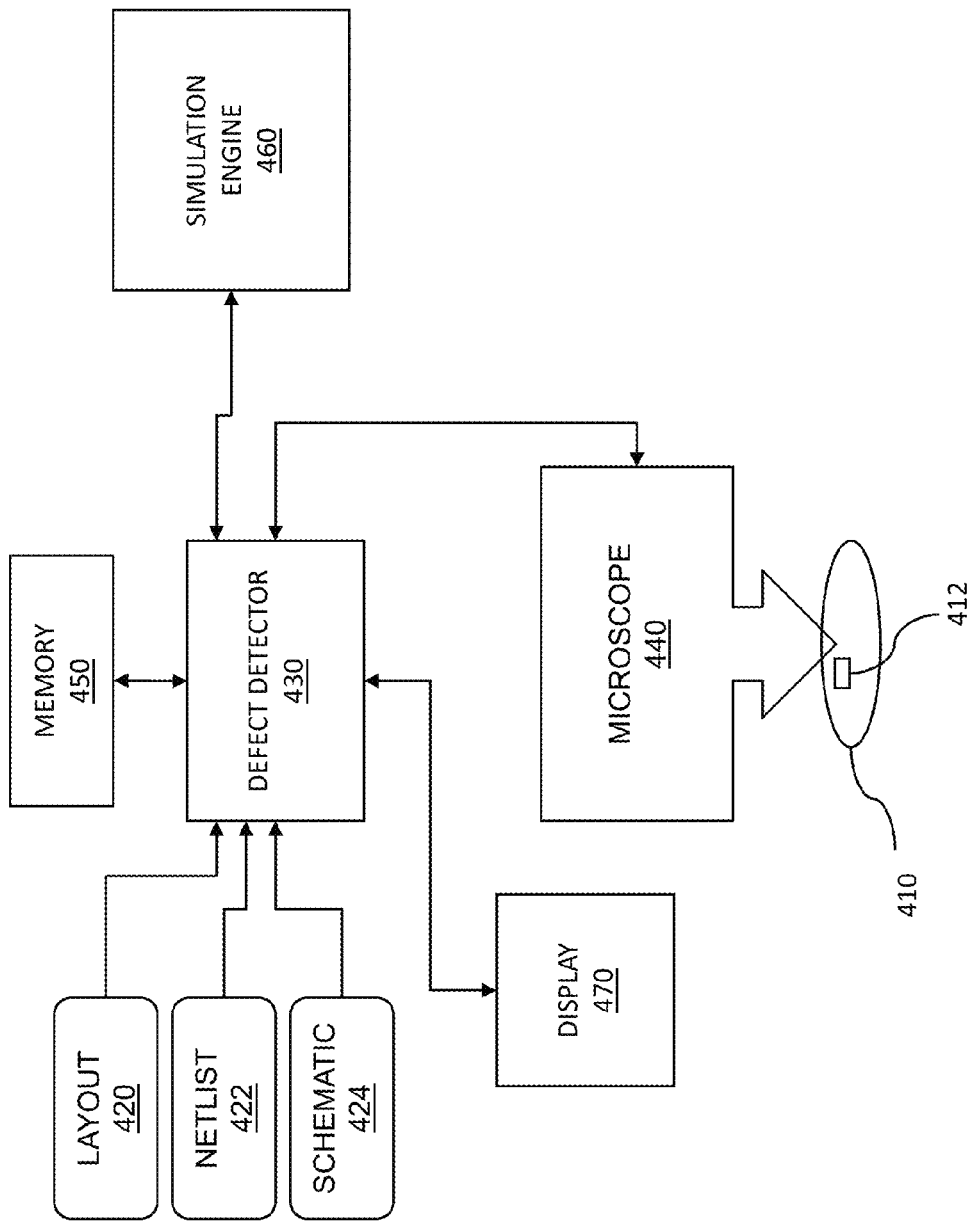
FIG. 4 is a system diagram for defect characterization.

FIG. 4 is a system diagram for defect characterization. A wafer 410 is shown with a semiconductor chip 412. In some cases the semiconductor chip may be a single chip or a portion of a chip mounted on a slide or substrate for analysis.

Various representations of the semiconductor chip are available to the system including some or all of a layout 420, a netlist 422, a schematic 424, and the like. The layout 420 may be in the form of GDSII or OASIS™ or some other format for describing various shapes, sizes, and relationships of elements in a semiconductor layout. The netlist 422 may be in Verilog™, VHDL™, transistor level netlist, or other hardware description language. The schematic 424 may be a graphical representation of the logical blocks, individual transistors, or other components of a semiconductor chip and interconnections between the blocks, transistors, or components. These various representations are used by the defect detector 430 to analyze any defects encountered by the microscope 440. The defect detector 430 may include one or more processors running instructions from the memory 450. The memory 450 may store instructions as well as analysis output, intermediate calculations, images from the microscope, and so on. The prober, which in embodiments may be part of the microscope 440 tool, may be an electrical prober, a contactless prober, an optical microscope, a scanning electron microscope, or other microscope type apparatus. The microscope 440 will capture images for use by the defect detector 430. When a defect is found in an image, the layout 420 is analyzed to identify which circuits are impacted by the defect. A simulation engine 460 will analyze the netlist 422 given the presence of the defect which was detected. The simulation may be Spice™ or other transistor level simulation with the defect that was detected being present in the transistor level simulation. The defect may be a short, a resistor, an open, a capacitive linkage, or other type of defect. The simulation may alternatively be logic level simulation using VHDL™, Verilog™, or some other logical representation with the defect that was detected being present in the logic. Simulation analysis can include the impact of process variation, changes in clock speed, performance delays, and so on. Results are shown on a display 470. The display 470 may show images captured by the microscope 440, results of simulation, waveforms from the simulation, the layout 420, the netlist 422, the schematic 424, and other information. The various representations may be cross mapped to show the defect on two or more of the representations.

Instructions for further analysis may be provided to the defect detector 430 or microscope 440 through human input via a keyboard, mouse, or other device. Further, the defect detector 430 may automatically drive further simulation analysis and microscopic image obtaining to further understand and analyze a defect that is detected. Voltage contrast may be used to emphasize the defect. The microscope may be navigated to the location of the defect or to other layout portions with similar geometries. These similar geometry locations can then, in turn, be examined for defects or obtain further information on defect free circuitry.

Figure 5:
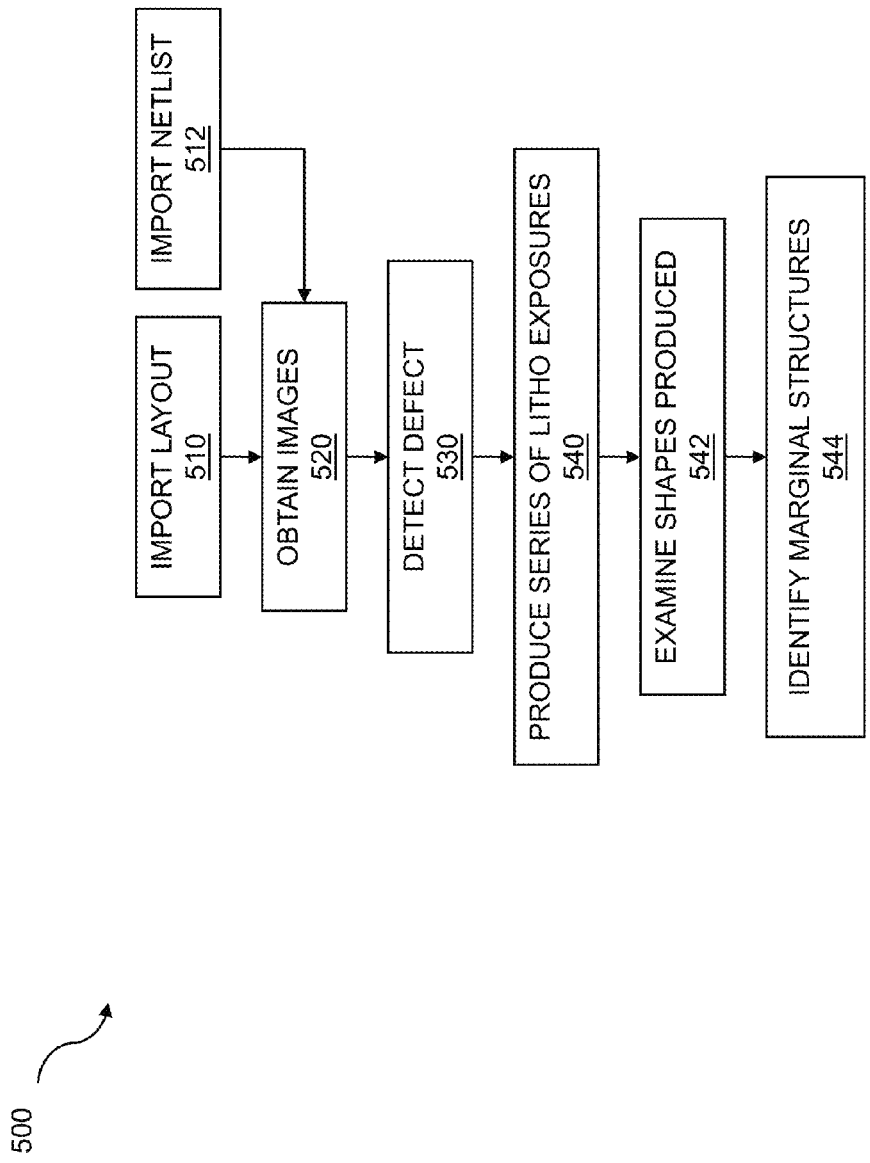
FIG. 5 is a flowchart for using modulated lithography exposures.

FIG. 5 is a flowchart for using modulated lithography exposures. A flow 500 is described for a computer implemented method for using modulated lithography exposures to aid in semiconductor fabrication. The flow 500 may begin with importing a layout 510 for a semiconductor circuit. The layout may be in the form of GDSII or OASIS™ or some other format for describing various shapes, sizes, and relationships of elements in a semiconductor layout. In some embodiments, the layout may already reside within a software tool and importing may be construed as using a layout already present in the tool. The flow 500 includes importing a netlist 512 for the semiconductor circuit. The netlist may be in Verilog™, VHDL™, transistor level netlist, or other hardware description language. In some embodiments, the netlist may already reside within a software tool and importing may be construed as using a netlist already present in the tool. The flow 500 continues with obtaining images 520 of a semiconductor chip which comprises the semiconductor circuit during fabrication. The images may be obtained with an optical microscope, a scanning electronic microscope, or some other microscope system.

The flow 500 continues with detecting a defect 530 in one of the images of the semiconductor chip wherein the defect is at a location on a portion the semiconductor chip that is represented by the layout. The detecting of the defect may be accomplished inline during semiconductor manufacturing. The defect may be a systematic defect or a random defect. Detection of the defect may be accomplished by software inspection of the images which were obtained looking for an anomaly in the images.

The flow 500 includes producing a series of modulated lithography exposures 540. This series may provide information on the optimal exposure to use during fabrication. The flow 500 may include examining shapes produced 542 by the series of modulated lithography exposures. The shapes may include necking, rounding, missing shapes, and the like to evaluate the fabrication process. The flow 500 includes identifying marginal structures 544 where a similar defect to the defect that was detected would impact circuit operation based on the series of modulated lithography exposures. In geometries which are similar to those where the defect was detected weaknesses may be identified and the lithography exposure tweaked to avoid future fabrication problems. Various steps in the flow 500 may be changed in order, repeated, omitted, or the like without departing from the disclosed inventive concepts. Various embodiments of the flow 500 may be included in a computer program product embodied in a non-transitory computer readable medium that includes code executable by one or more processors.

Figure 6:
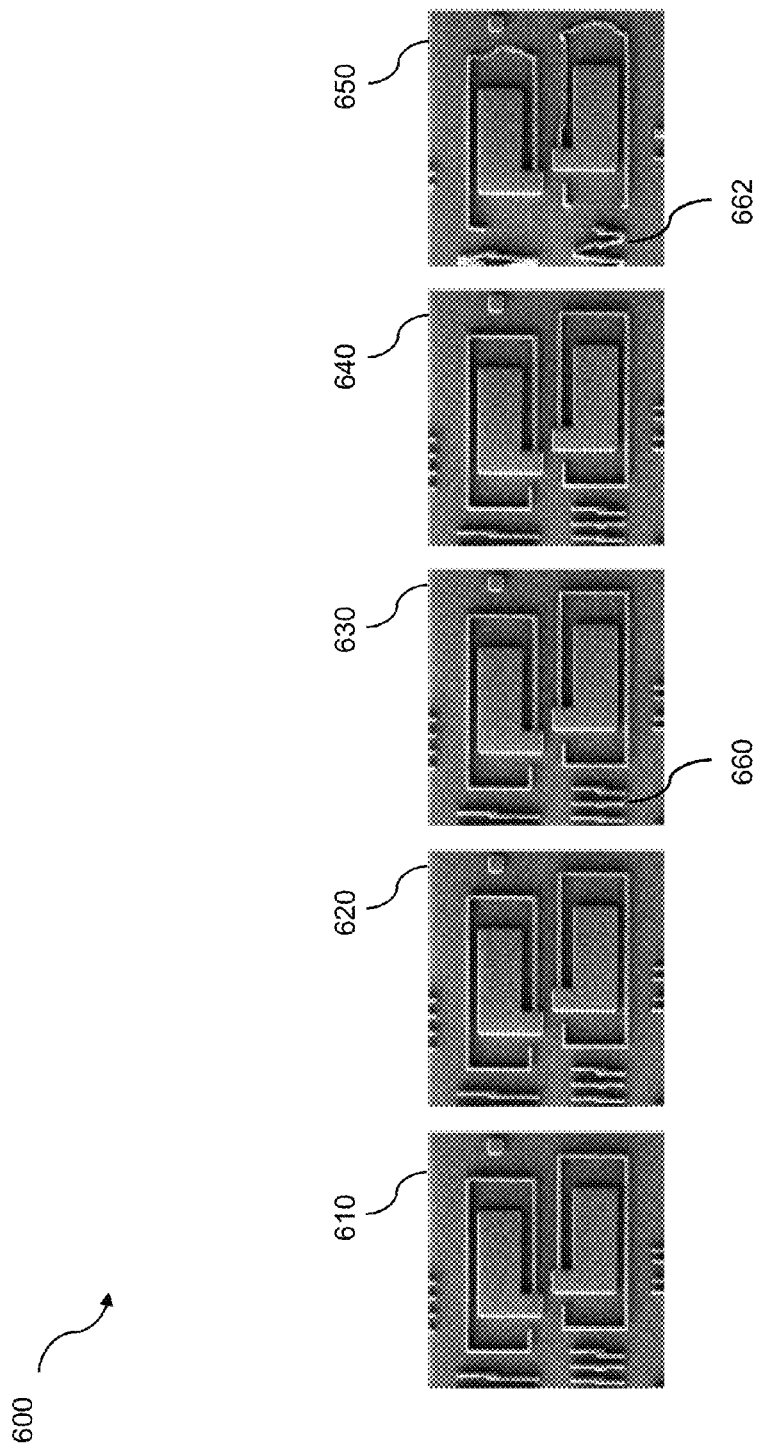
FIG. 6 is a diagram showing example modulated lithography exposures.

FIG. 6 is a diagram showing example modulated lithography exposures 600. A first FIG. 610, a second FIG. 620, a third FIG. 630, a fourth FIG. 640, and a fifth FIG. 650 are shown for various lithography exposures for a portion of a semiconductor chip where the images were obtained with a scanning electron microscope. In these example lithography exposure images the shapes can be seen to modify with lithography exposure. For instance, a first set of shapes 660 in the third FIG. 630 can be seen to be distinct. For another lithography exposure, the shapes 662 in the fifth FIG. 650 can be seen to run together and no longer be distinct. Based on these variations in lithography exposure and the resulting shapes a good lithography exposure setting can be chosen for the fabrication process of this semiconductor chip portion.

Figure 7:
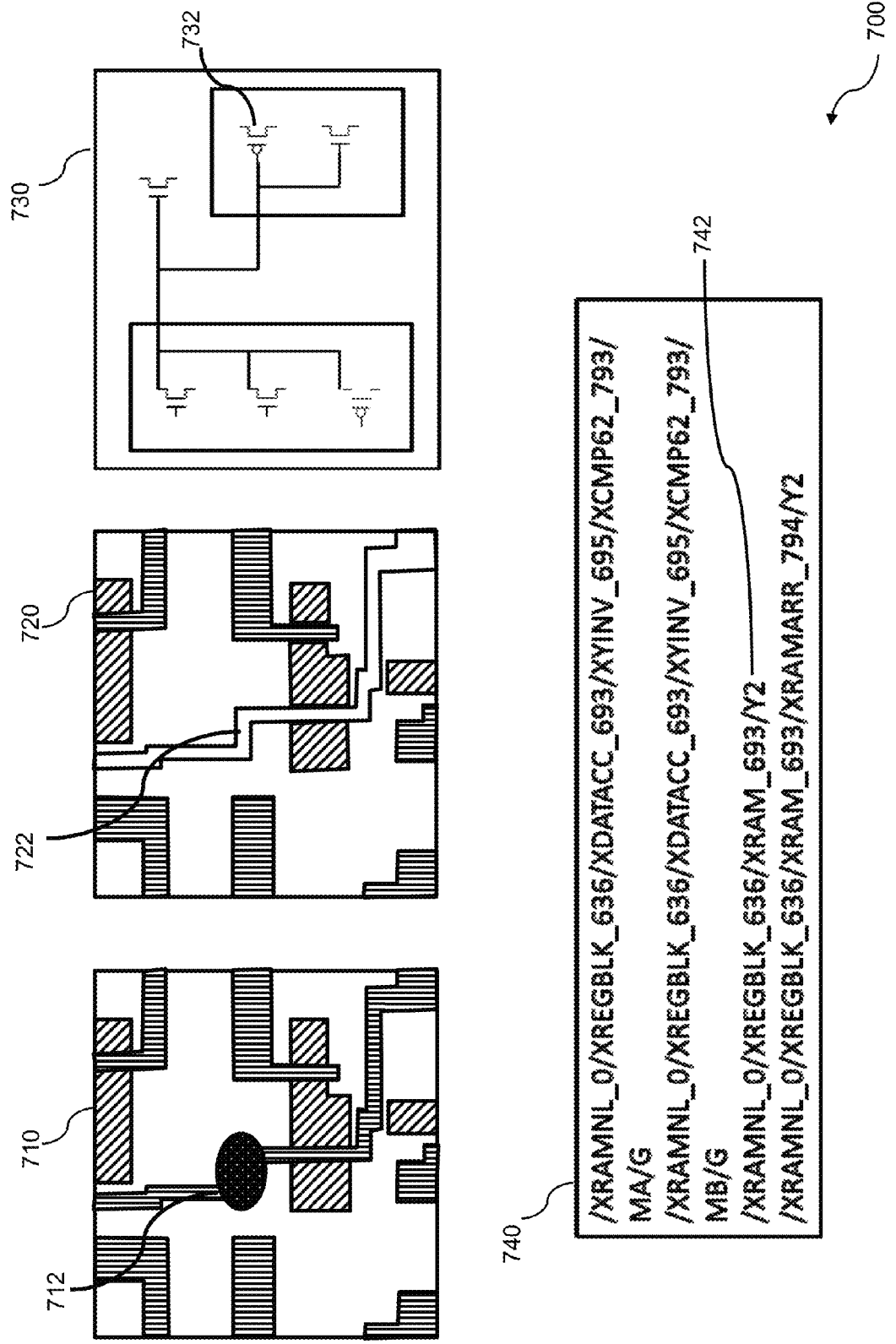
FIG. 7 is a diagram showing an example layout, schematic, and netlist.

FIG. 7 is a diagram showing an example layout, schematic, and netlist. A group of representations 700 are shown that can be used to analyze a defect and its impact on the circuitry. A first layout image 710 is shown with a location 712 of a defect that was detected. A second layout image 720 is shown without the defect location present and the normal polygon shapes 722 included. A schematic image 730 is shown. A location for the defect 732 is included. A netlist image 740 is shown. A location for the defect 742 is included. Two or more of the various representations may be cross mapped so that the defect location can be highlighted. In some embodiments, other representations may be shown with further detail about the defect and its impact.

Figure 8:
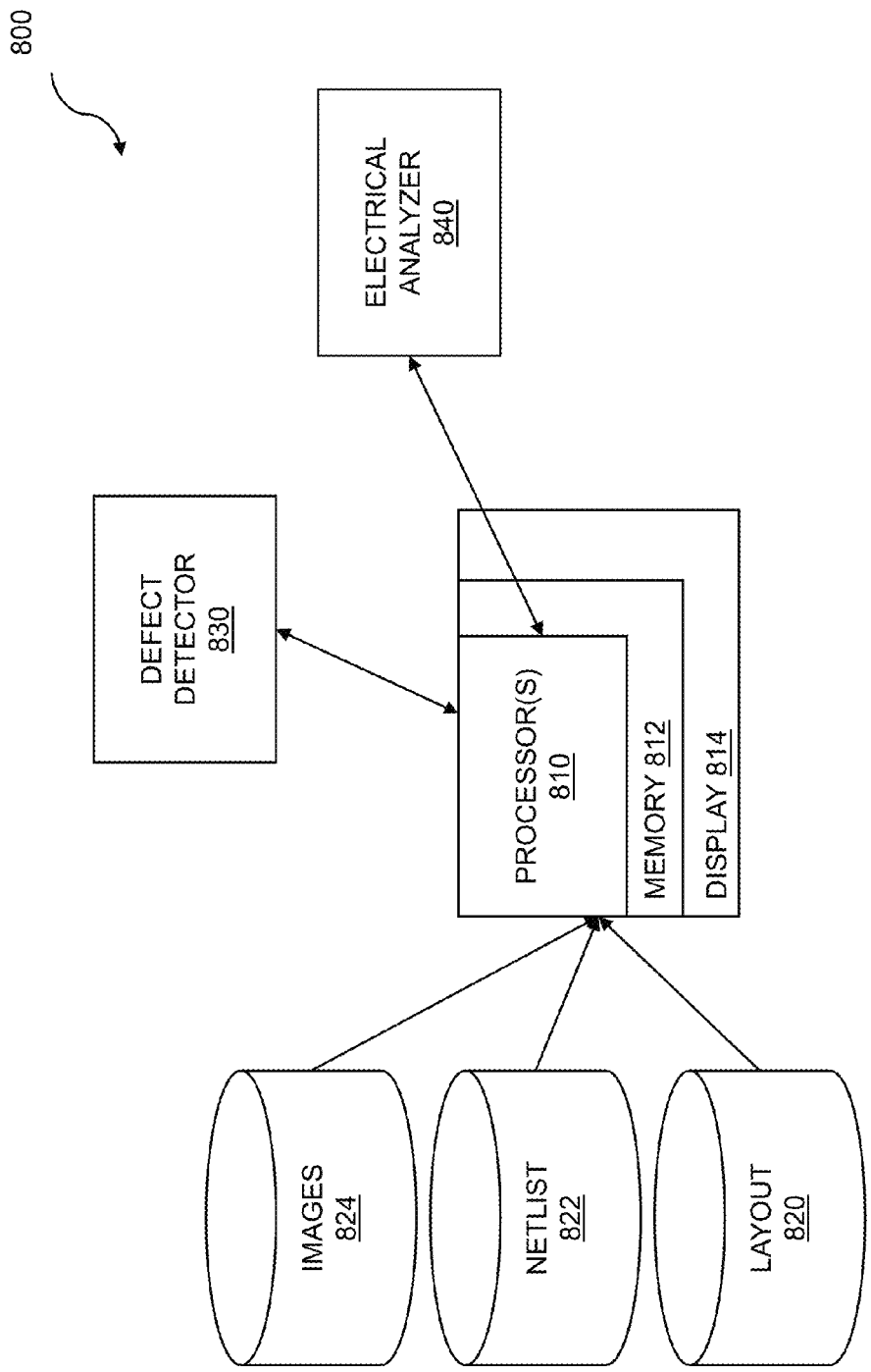
FIG. 8 is a system diagram for performing defect detection and analysis.

FIG. 8 is a system diagram for performing defect detection and analysis. The system 800 may include one or more processors 810 and a memory 812 which stores instructions. The memory 812 is coupled to the one or more processors 810 wherein the one or more processors 810 can execute instructions stored in the memory 812. The memory 612 may be used for storing instructions, for storing circuit designs, for storing logic designs, for storing images, for system support, and the like.

The one or more processors 810 may import a layout 820 for a given semiconductor wafer, kerf, chip, or other device. The one or more processors 810 may import a netlist 822 corresponding to the layout or a portion thereof. The netlist may be in the form of Verilog™, VHDL™, or other design language. The netlist may describe connections between blocks, gates, or transistors within a semiconductor chip. In some embodiments, both netlists and schematics may be used together. The one or more processors 810 may obtain images 824 corresponding to the layout or a portion thereof. The images 824 may have been stored or may be read in from an imaging device. Some or all of the layout 820, the netlist 822, and the images 824 may be shown on a display 814 coupled to the one or more processors 810.

A defect detector 830 may analyze the images 824 to identify or detect defects. The defect detector 830 may focus on certain portions of the layout 820 based on a type of electrical failure on the semiconductor device. An electrical analyzer 840 may simulate the netlist 822, and thereby perform electrical analysis, with defects which were detected by the defect detector 830. Information from the electrical analyzer 840 may be fed to the defect detector 830 to identify a portion of the layout 820 on which to focus on for possible defects. In at least some embodiments, the defect detector 830 and/or the electrical analyzer 840 functions are accomplished by the one or more processors 810. In embodiments, the system 800 may include computer program product embodied in a non-transitory computer readable medium for defect characterization, the computer program product comprising: code for importing a layout for a semiconductor circuit; code for importing a netlist for the semiconductor circuit; code for obtaining images of a semiconductor chip which comprises the semiconductor circuit during fabrication; code for detecting a defect in one of the images of the semiconductor chip wherein the defect is at a location on a portion the semiconductor chip that is represented by the layout; and code for performing electrical analysis of the netlist with the defect which was detected. The computer program product may also comprise code for importing a layout for a semiconductor circuit; code for importing a netlist for the semiconductor circuit; code for obtaining images of a semiconductor chip which comprises the semiconductor circuit during fabrication; code for detecting a defect larger than a critical dimension in one of the images of the semiconductor chip; and code for performing electrical analysis of the netlist with the detected defect.

Each of the above methods may be executed on one or more processors on one or more computer systems. Embodiments may include various forms of distributed computing, client/ server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer implemented method for performing defect characterization comprising:
   importing a layout for a semiconductor circuit;
   importing a netlist for the semiconductor circuit;
   obtaining images of a semiconductor chip which comprises the semiconductor circuit during fabrication;
   detecting, using one or more processors, a defect in one of the images of the semiconductor chip wherein the defect is at a location on a portion of the semiconductor chip that is represented by the layout and wherein the detecting is based on determining a critical volume; and performing an electrical analysis of the netlist with the detected defect.

2. The method according to claim 1 wherein the detecting the defect is accomplished inline during semiconductor manufacturing.

3. The method according to claim 1 further comprising importing a schematic for the semiconductor circuit.

4. The method according to claim 3 further comprising cross mapping between two of a group comprising the netlist, the schematic, and the layout.

5. The method according to claim 1 wherein the defect is detected using one of a group comprising an optical microscope and a scanning electronic microscope.

6. The method according to claim 1 wherein the defect is emphasized using voltage contrast.

7. The method according to claim 1 further comprising identifying an intersection of nets based on a failure of electrical operation.

8. The method according to claim 7 wherein the obtaining of the images is based on the intersection of the nets which were identified.

9. The method according to claim 1 further comprising determining a critical dimension.

10. The method according to claim 9 further comprising filtering out defects smaller than the critical dimension.

11. The method according to claim 9 wherein the critical dimension is between shapes on a single level.

12. The method according to claim 1 further comprising filtering out defects smaller than the critical volume.

13. The method according to claim 1 wherein the critical volume is between shapes on a plurality of levels.

14. The method according to claim 1 further comprising ranking the defect and a second defect based on their impacts on operation of the semiconductor circuit.

15. The method according to claim 1 further comprising using an uncertainty value for the location to determine a range of possible defect locations.

16. The method according to claim 15 further comprising analyzing the possible defect locations for impact to operation of the semiconductor circuit.

17. The method according to claim 1 further comprising determining a cell in the semiconductor circuit in which the defect resides.

18. The method according to claim 17 further comprising extracting nets from the cell.

19. The method according to claim 1 further comprising correlating an impact of the defect on electrical operation of the semiconductor circuit.

20. The method according to claim 19 wherein the correlating relates to one of a group comprising yield analysis, parametric information, fabrication process data, and circuit speed.

21. The method according to claim 1 further comprising classifying the defect which was detected.

22. The method according to claim 1 wherein the electrical analysis of the netlist with the defect is performed using transistor level simulation.

23. The method according to claim 22 wherein the transistor level simulation includes Monte Carlo analysis.

24. The method according to claim 1 further comprising searching through the layout for similar geometries to the layout of the portion of the semiconductor chip where the defect was detected.

25. The method according to claim 24 wherein one or more additional defects are detected on the similar geometries.

26. The method according to claim 24 further comprising performing categorical binning of the similar geometries.

27. The method according to claim 1 further comprising producing a series of modulated lithography exposures; examining shapes produced by the series of modulated lithography exposures; and identifying marginal structures where a similar defect to the defect that was detected would impact circuit operation based on the series of modulated lithography exposures.

28. The method according to claim 1 further comprising providing CAD navigation on the semiconductor chip to the location where the defect was detected.

29. A computer program product embodied in a non-transitory computer readable medium, when executed by a computer, causes the computer to perform defect characterization, the computer program product comprising:
- code for importing a layout for a semiconductor circuit;
- code for importing a netlist for the semiconductor circuit;
- code for obtaining images of a semiconductor chip which comprises the semiconductor circuit during fabrication;
- code for detecting a defect in one of the images of the semiconductor chip wherein the defect is at a location on a portion of the semiconductor chip that is represented by the layout and wherein the detecting is based on determining a critical volume; and
- code for performing electrical analysis of the netlist with the detected defect.

30. A computer system for defect characterization comprising:
- a memory for storing instructions;
- one or more processors coupled to the memory wherein the one or more processors, when executing the instructions which are stored, are configured to:
  - import a layout for a semiconductor circuit;
  - import a netlist for the semiconductor circuit;
  - obtain images of a semiconductor chip which comprises the semiconductor circuit during fabrication;
  - detect a defect in one of the images of the semiconductor chip wherein the defect is at a location on a portion of the semiconductor chip that is represented by the layout and wherein detection is based on determining a critical volume; and
  - perform an electrical analysis of the netlist with detected defect.

31. The system of claim 30 wherein the one or more processors are further configured to import a schematic for the semiconductor circuit and cross map between two of a group comprising the netlist, the schematic, and the layout.

32. The system of claim 30 wherein the one or more processors are further configured to identify an intersection of nets based on a failure of electrical operation.

33. The system of claim 30 wherein the one or more processors are further configured to filter out defects smaller than the critical volume.

34. The system of claim 30 wherein the one or more processors are further configured to use an uncertainty value for the location to determine a range of possible defect locations.

35. The system of claim 30 wherein the one or more processors are further configured to search through the layout for similar geometries to the layout of the portion of the semiconductor chip where the defect was detected.

36. A computer program product embodied in a non-transitory computer readable medium, when executed by a computer, causes the computer to perform defect characterization, the computer program product comprising:
- code for importing a layout for a semiconductor circuit;
- code for importing a netlist for the semiconductor circuit;
- code for obtaining images of a semiconductor chip which comprises the semiconductor circuit during fabrication;

code for detecting a defect larger than a critical dimension in one of the images of the semiconductor chip and wherein the detecting is based on determining a critical volume; and code for performing electrical analysis of the netlist with the detected defect.

37. The computer program product of claim 36 further comprising code for importing a schematic for the semiconductor circuit and cross mapping between two of a group comprising the netlist, the schematic, and the layout.

38. The computer program product of claim 36 further comprising code for identifying an intersection of nets based on a failure of electrical operation.

39. The computer program product of claim 36 further comprising code for filtering out defects smaller than the critical volume.

40. The computer program product of claim 36 further comprising code for using an uncertainty value for the location to determine a range of possible defect locations.

41. The computer program product of claim 36 further comprising code for searching through the layout for similar geometries to the layout of the portion of the semiconductor chip where the defect was detected.

\* \* \* \* \*